United States Patent
Kuriki et al.

(10) Patent No.: US 9,960,225 B2
(45) Date of Patent: May 1, 2018

(54) MANUFACTURING METHOD OF POWER STORAGE DEVICE

(75) Inventors: Kazutaka Kuriki, Kanagawa (JP); Michiko Konishi, Kanagawa (JP); Asami Tadokoro, Tokyo (JP); Yasunori Yoshida, Aichi (JP); Kiyofumi Ogino, Kanagawa (JP); Toshihiko Takeuchi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 835 days.

(21) Appl. No.: 13/164,839

(22) Filed: Jun. 21, 2011

(65) Prior Publication Data

US 2012/0003530 A1 Jan. 5, 2012

(30) Foreign Application Priority Data

Jun. 30, 2010 (JP) ................................ 2010-148879
Jun. 30, 2010 (JP) ................................ 2010-148884

(51) Int. Cl.
*H01M 4/1395* (2010.01)
*H01M 4/134* (2010.01)
(Continued)

(52) U.S. Cl.
CPC ............. *H01L 28/84* (2013.01); *H01G 11/06* (2013.01); *H01G 11/12* (2013.01); *H01G 11/28* (2013.01);
(Continued)

(58) Field of Classification Search
CPC combination set(s) only.
See application file for complete search history.

(56) References Cited

U.S. PATENT DOCUMENTS

| 3,796,598 A | 3/1974 | Gejyo et al. |
| 4,155,781 A | 5/1979 | Diepers |

(Continued)

FOREIGN PATENT DOCUMENTS

| EP | 0690517 A | 1/1996 |
| EP | 0693792 A | 1/1996 |

(Continued)

OTHER PUBLICATIONS

Li-Feng Cui et al., "Crystalline-Amorphous Core-Shell Silicon Nanowires for High Capacity and High Current Battery Electrodes", Nano Lett. (Nano Letters), 2009, vol. 9, No. 1, pp. 491-495.

(Continued)

*Primary Examiner* — Daniel Gatewood
(74) *Attorney, Agent, or Firm* — Nixon Peabody LLP; Jeffrey L. Costellia

(57) ABSTRACT

It is an object to improve performance of a power storage device, such as cycle characteristics. A power storage device includes a current collector and a crystalline semiconductor layer including a whisker, which is formed on and in close contact with the current collector. Separation of the crystalline semiconductor layer is suppressed by an increase of adhesion, whereby cycle characteristics in which a specific capacity of a tenth cycle number with respect to a first cycle number is greater than or equal to 90% is realized. In addition, cycle characteristics in which a specific capacity of a hundredth cycle number with respect to a first cycle number is greater than or equal to 70% is realized.

10 Claims, 10 Drawing Sheets

(51) Int. Cl.

| | | |
|---|---|---|
| *H01G 11/06* | (2013.01) | |
| *H01G 11/28* | (2013.01) | |
| *H01L 49/02* | (2006.01) | |
| *H01G 11/12* | (2013.01) | |
| *H01G 11/70* | (2013.01) | |
| *H01G 11/86* | (2013.01) | |
| *H01M 4/04* | (2006.01) | |
| *H01M 4/66* | (2006.01) | |
| *H01M 10/052* | (2010.01) | |

(52) U.S. Cl.
CPC ............. *H01G 11/70* (2013.01); *H01G 11/86* (2013.01); *H01M 4/0428* (2013.01); *H01M 4/134* (2013.01); *H01M 4/1395* (2013.01); *H01M 4/667* (2013.01); *H01M 10/052* (2013.01); *Y02E 60/13* (2013.01)

(56) References Cited

U.S. PATENT DOCUMENTS

| | | |
|---|---|---|
| 5,338,625 A | 8/1994 | Bates et al. |
| 5,641,591 A | 6/1997 | Kawakami et al. |
| 5,824,434 A | 10/1998 | Kawakami et al. |
| 6,051,340 A | 4/2000 | Kawakami et al. |
| 6,334,939 B1 | 1/2002 | Zhou et al. |
| 6,451,113 B1 | 9/2002 | Givargizov |
| 6,514,395 B2 | 2/2003 | Zhou et al. |
| 6,645,667 B1 | 11/2003 | Iwamoto et al. |
| 6,685,804 B1 | 2/2004 | Ikeda et al. |
| 6,815,003 B2 | 11/2004 | Yagi et al. |
| 6,844,113 B2 | 1/2005 | Yagi et al. |
| 6,887,511 B1 | 5/2005 | Shima et al. |
| 7,015,496 B2 | 3/2006 | Ohnuma et al. |
| 7,192,673 B1 | 3/2007 | Ikeda et al. |
| 7,235,330 B1 | 6/2007 | Fujimoto et al. |
| 7,241,533 B1 | 7/2007 | Ikeda et al. |
| 7,396,409 B2 | 7/2008 | Hatta et al. |
| 7,410,728 B1 | 8/2008 | Fujimoto et al. |
| 7,714,535 B2 | 5/2010 | Yamazaki et al. |
| 7,794,881 B1 | 9/2010 | Fujimoto et al. |
| 7,816,031 B2 | 10/2010 | Cui et al. |
| 7,846,583 B2 | 12/2010 | Oh et al. |
| 7,852,044 B2 | 12/2010 | Yamazaki et al. |
| 8,054,035 B2 | 11/2011 | Yamazaki et al. |
| 8,692,249 B2 | 4/2014 | Yamazaki et al. |
| 8,877,374 B2 | 11/2014 | Cui et al. |
| 2002/0102348 A1* | 8/2002 | Yagi et al. ............... 427/58 |
| 2002/0177044 A1 | 11/2002 | Yagi et al. |
| 2005/0037935 A1* | 2/2005 | Abd Elhamid et al. ...... 510/175 |
| 2005/0244324 A1 | 11/2005 | Hatta et al. |
| 2007/0007239 A1* | 1/2007 | Lee et al. ................. 216/13 |
| 2007/0232028 A1 | 10/2007 | Lee et al. |
| 2007/0292339 A1 | 12/2007 | Kubomura |
| 2008/0020281 A1 | 1/2008 | Kogetsu et al. |
| 2008/0233478 A1 | 9/2008 | Hirose et al. |
| 2009/0050204 A1 | 2/2009 | Habib |
| 2009/0117462 A1* | 5/2009 | Okazaki et al. ........... 429/218.1 |
| 2009/0136847 A1 | 5/2009 | Jeong et al. |
| 2009/0170001 A1 | 7/2009 | Roozeboom et al. |
| 2009/0214944 A1 | 8/2009 | Rojeski |
| 2009/0302419 A1 | 12/2009 | Kemmeren et al. |
| 2009/0317726 A1 | 12/2009 | Hirose et al. |
| 2009/0325365 A1 | 12/2009 | Park et al. |
| 2010/0086837 A1 | 4/2010 | Asari et al. |
| 2010/0151322 A1* | 6/2010 | Sato et al. ............... 429/218.1 |
| 2010/0178564 A1 | 7/2010 | Asari et al. |
| 2010/0209784 A1 | 8/2010 | Yamazaki et al. |
| 2010/0266898 A1 | 10/2010 | Yamamoto et al. |
| 2011/0027655 A1 | 2/2011 | Rojeski |
| 2011/0151290 A1 | 6/2011 | Cui et al. |
| 2011/0266654 A1 | 11/2011 | Kuriki et al. |
| 2011/0294005 A1 | 12/2011 | Kuriki et al. |
| 2011/0294011 A1 | 12/2011 | Kuriki et al. |
| 2011/0300445 A1 | 12/2011 | Murakami et al. |
| 2011/0305950 A1 | 12/2011 | Kuriki et al. |
| 2012/0003383 A1 | 1/2012 | Furuno |
| 2012/0003807 A1 | 1/2012 | Furuno et al. |
| 2012/0328962 A1 | 12/2012 | Takeuchi et al. |
| 2014/0217414 A1 | 8/2014 | Yamazaki et al. |

FOREIGN PATENT DOCUMENTS

| | | |
|---|---|---|
| EP | 1339116 A | 8/2003 |
| EP | 2219226 A | 8/2010 |
| JP | 08-050922 A | 2/1996 |
| JP | 08-088022 A | 4/1996 |
| JP | 2001-210315 | 8/2001 |
| JP | 2002-083594 | 3/2002 |
| JP | 2002-170554 | 6/2002 |
| JP | 2002-237294 | 8/2002 |
| JP | 2002-373644 | 12/2002 |
| JP | 2003-246700 | 9/2003 |
| JP | 2004-171875 A | 6/2004 |
| JP | 2004-207117 A | 7/2004 |
| JP | 2004-224576 | 8/2004 |
| JP | 2004-281317 | 10/2004 |
| JP | 2004-533699 | 11/2004 |
| JP | 2008-512838 | 4/2008 |
| JP | 2008-103118 A | 5/2008 |
| JP | 2008-522360 | 6/2008 |
| JP | 2008-270154 | 11/2008 |
| JP | 2009-134917 A | 6/2009 |
| JP | 2009-289586 | 12/2009 |
| JP | 2010-033968 | 2/2010 |
| JP | 2010-103051 | 5/2010 |
| JP | 2010-262752 | 11/2010 |
| TW | 200826335 | 6/2008 |
| TW | M361106 | 7/2009 |
| TW | 201004098 | 1/2010 |
| TW | 201004099 | 1/2010 |
| WO | WO-2001/096847 | 12/2001 |
| WO | WO-2006/028316 A1 | 3/2006 |
| WO | WO-2006/056959 | 6/2006 |
| WO | WO-2006/056964 | 6/2006 |
| WO | WO 2008047668 A1 * | 4/2008 |
| WO | WO-2009/038897 | 3/2009 |
| WO | WO-2009/108731 A2 | 9/2009 |

OTHER PUBLICATIONS

Kamins.T et al., "Ti-catalyzed Si nanowires by chemical vapor deposition: Microscopy and growth mechanisms", J. Appl. Phys. (Journal of Applied Physics), Jan. 15, 2001, vol. 89, No. 2, pp. 1008-1016.

Kohno.H et al., "Silicon Nanoneedles Grown by a Simple Thermal Treatment Using Metal-Sulfur Catalysts", Jpn. J. Appl. Phys.(Japanese Journal of Applied Physics), Feb. 2002, vol. 41, Part 1, No. 2A, pp. 577-578.

International Search Report (Application No. PCT/JP2011/063434), dated Sep. 13, 2011.

Written Opinion (Application No. PCT/JP2011/063434), dated Sep. 13, 2011.

Jung.H et al., "Amorphous silicon thin-film negative electrode prepared by low pressure chemical vapor deposition for lithium-ion batteries", Solid State Communications, Feb. 2003, vol. 125, No. 7-8, pp. 387-390.

Gangloff.L et al., "Self-Aligned, Gated Arrays of Individual Nanotube and Nanowire Emitters", Nano Letters, Jul. 29, 2004, vol. 4, No. 9, pp. 1575-1579.

Chan.C et al., "High-performance lithium battery anodes using silicon nanowires", Nature Nanotechnology, Dec. 16, 2007, vol. 3, pp. 31-35.

Felter.T et al., "Cathodoluminescent Field Emission Flat Panel Display Prototype Built Using Arrays of Diamond-Coated Silicon Tips", SID Digest '98 : SID International Symposium Digest of Technical Papers, May 1, 1998, vol. 29, pp. 577-581.

Leu.I et al., "Chemical Vapor Deposition of Silicon Carbide Whiskers Activated by Elemental Nickel", J. Electrochem. Soc. (Journal of the Electrochemical Society), 1999, vol. 146, No. 1, pp. 184-188.

(56) References Cited

OTHER PUBLICATIONS

Pedraza.A et al., "Silicon microcolumn arrays grown by nanosecond pulsed-excimer laser irradiation", Appl. Phys. Lett. (Applied Physics Letters) , Apr. 19, 1999, vol. 74, No. 16, pp. 2322-2324.
Albuschies.J et al., "High-Density Silicon Nanowire Growth From Self-Assembled Au Nanoparticles", Microelectronic Engineering, Feb. 20, 2006, vol. 83, pp. 1530-1533, Elsevier.
Taiwanese Office Action (Application No. 100122818) Dated Mar. 4, 2015.

\* cited by examiner

MANUFACTURING METHOD OF POWER STORAGE DEVICE

TECHNICAL FIELD

The technical field of the present invention relates to a power storage device and a method for manufacturing the power storage device.

Note that the power storage device indicates all elements and devices which have a function of storing power.

BACKGROUND ART

In recent years, power storage devices such as lithium-ion secondary batteries, lithium-ion capacitors, and air cells have been developed.

As an active material of an electrode for the power storage device, for example, a material such as carbon or silicon is used. In the power storage device, these materials can occlude and release a reactive material (e.g., lithium ions). In addition, silicon (or phosphorus-doped silicon) has an advantage of larger theoretical capacity than carbon and larger capacity of a power storage device (e.g., Patent Document 1).

REFERENCE

[Patent Document 1] Japanese Published Patent Application No. 2001-210315

DISCLOSURE OF INVENTION

However, there has been a problem in that the volume of silicon expands when the reactive material is occluded and released. Thus, separation (also referred to as peeling) of silicon from the electrode occurs by the expansion of volume, which leads to deterioration of a power storage device. Further, the performance of the power storage device has been lowered by separation of silicon.

Thus, an object of one embodiment of the present invention is to suppress separation of an active material layer in the case where a semiconductor material such as silicon is used as an active material.

In addition, another object of one embodiment of the present invention is to improve various performances of a power storage device, for example, the charge and discharge capacities.

In a power storage device disclosed herein, a crystalline semiconductor layer is used as an active material layer of an electrode. In addition, the crystalline semiconductor layer includes a whisker.

One embodiment of the present invention is a power storage device which includes a current collector and a crystalline semiconductor layer including a whisker, which is formed over the current collector, and in the power storage device, a specific capacity of a tenth cycle number with respect to a first cycle number is greater than or equal to 90%. In this specification, a cycle number is the number of charge and discharge in the power storage device. In addition, a specific capacity of a tenth cycle number with respect to a first cycle number is a capacity obtained by dividing a capacity of tenth charge or discharge by a capacity of first charge or discharge in the power storage device.

Another embodiment of the present invention is a power storage device which includes a current collector and a crystalline semiconductor layer including a whisker, which is formed on and in close contact with the current collector, and in the power storage device, a specific capacity of a tenth cycle number with respect to a first cycle number is greater than or equal to 90%.

Another embodiment of the present invention is a power storage device which includes a first electrode including a current collector and a crystalline semiconductor layer including a whisker, which is formed on and in close contact with the current collector; an electrolyte; and a second electrode which is provided to face the first electrode with the electrolyte interposed therebetween, and in the power storage device, a specific capacity of a tenth cycle number with respect to a first cycle number is greater than or equal to 90%.

One embodiment of the present invention is a method for manufacturing a power storage device, in which surface treatment is performed on a current collector and a crystalline semiconductor layer including a whisker is formed over the current collector.

Another embodiment of the present invention is a method for manufacturing a power storage device, in which a current collector is processed with a hydrofluoric acid and a crystalline semiconductor layer including a whisker is formed over the current collector.

Another embodiment of the present invention is a method for manufacturing a power storage device, in which a current collector is processed with a hydrofluoric acid and a crystalline semiconductor layer including a whisker is formed over the current collector by a low-pressure chemical vapor deposition (LPCVD) method.

Another embodiment of the present invention is a method for manufacturing a power storage device, in which a current collector is processed with a hydrofluoric acid and a crystalline semiconductor layer including a whisker is formed over the current collector with a source gas containing silicon by a low-pressure chemical vapor deposition method.

Moreover, after the current collector is processed with a hydrofluoric acid as described above, the current collector may be processed with running water.

Another embodiment of the present invention is an electric propulsion vehicle which is provided with the above power storage device.

According to one embodiment of the present invention, a surface area of an active material is increased by including a whisker; thus, various performances of a power storage device, for example, the charge and discharge capacities can be improved.

Moreover, cycle characteristics and the like of a power storage device can be improved by including a crystalline semiconductor layer which is formed on and in close contact with a current collector and which forms an electrode.

Further, adhesion between a current collector and a crystalline semiconductor layer can be increased by performing surface treatment on the current collector. The deterioration of a power storage device can be suppressed by an increase of the adhesion, and productivity of a power storage device can be improved.

BEST MODE FOR CARRYING OUT THE INVENTION

Figure 1A:
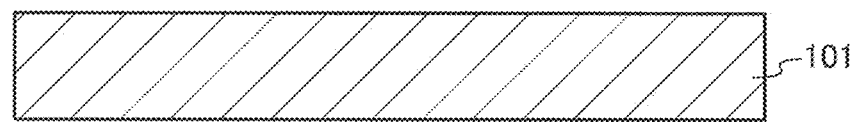
FIGS. 1A to 1C are cross-sectional views illustrating a method for manufacturing a power storage device.

Hereinafter, examples of embodiments of the present invention will be described with reference to the drawings. Note that the present invention is not limited to the following description, and it will be easily understood by those skilled in the art that various changes and modifications can be made without departing from the spirit and scope of the present invention. Thus, the present invention should not be interpreted as being limited to the following description of the embodiments. In description with reference to the drawings, in some cases, the same reference numerals are used in common for the same portions in different drawings. Further, in some cases, the same hatching patterns are applied to similar parts, and the similar parts are not necessarily designated by reference numerals.

Embodiment 1

In this embodiment, a manufacturing method, a structure, and performance of a power storage device will be described.

Figure 1B:
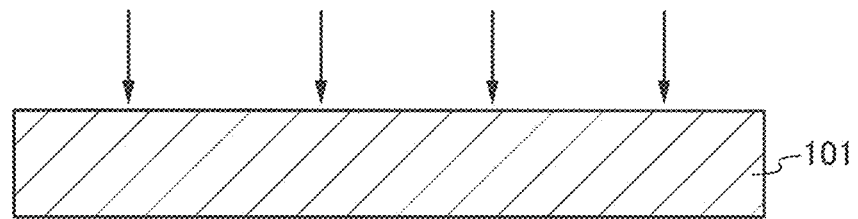
Figure 1C:
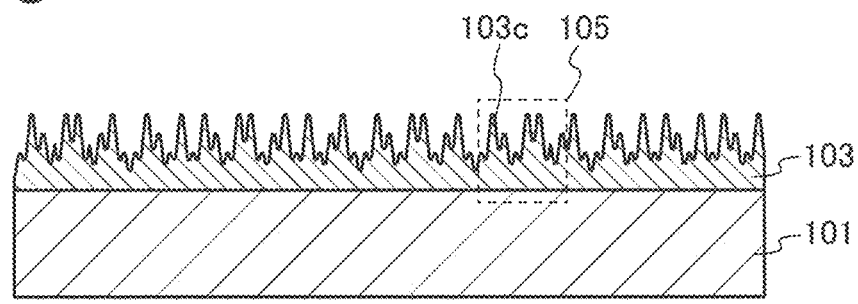

FIGS. 1A to 1C illustrate a manufacturing method of an electrode of a power storage device.

First, a current collector 101 is prepared (FIG. 1A). The current collector 101 functions as a terminal which extracts electricity.

The current collector 101 can be formed using a metal material typified by platinum, aluminum, copper, or titanium. The current collector 101 may be formed using an aluminum alloy to which an element which improves heat resistance, such as silicon, titanium, neodymium, scandium, or molybdenum, is added. Note that the current collector 101 can have a foil shape, a plate shape, a net shape, or the like.

Next, surface treatment is performed on the current collector 101 (FIG. 1B). For example, treatment with a hydrofluoric acid whose concentration is higher than or equal to 0.1% and lower than or equal to 1% is performed for longer than or equal to one minute and shorter than or equal to an hour. By the surface treatment, cleanliness or the like of the surface of the current collector 101 is improved and a depression and a projection become larger; thus, adhesion to a crystalline semiconductor layer to be formed later can be increased. The depression and projection are increased, whereby a so-called anchor effect occurs. Accordingly, the adhesion can be increased because a semiconductor material is penetrated into a depression and deposited therein. Note that after the hydrofluoric acid treatment or the like is performed as the surface treatment, running water treatment may be performed. The cleanliness of the surface of the current collector 101 is further improved by the running water treatment (also referred to as running water cleaning). Note that in the case where the electrode is formed using both surfaces of the current collector 101, surface treatment is performed on the rear surface of the current collector 101 similarly to the front surface.

Next, a crystalline semiconductor layer 103 including a whisker is formed over the current collector 101 by an LPCVD method (FIG. 1C). The crystalline semiconductor layer 103 functions as an active material layer of the power storage device. Here, silicon is used as a semiconductor material.

The LPCVD method is performed while a substrate is heated using a source gas containing silicon. As the source gas, silicon hydride, silicon fluoride, and silicon chloride are given; typically, $SiH_4$, $Si_2H_6$, $SiF_4$, $SiCl_4$, $Si_2Cl_6$, and the like are given. The heating is performed at a temperature higher than 550° C. and lower than or equal to the upper limit temperature which an LPCVD apparatus or the current collector 101 can withstand, preferably a temperature higher than or equal to 580° C. and lower than 650° C. Note that one or more of a rare gas such as helium, neon, argon, and xenon; nitrogen; and hydrogen may be mixed to the source gas. The pressure is set higher than or equal to the lower limit pressure at which the pressure can be held after the flow of the source gas and lower than or equal to 200 Pa.

Here, a whisker is a crystal which grows from a semiconductor material (e.g., silicon) to have a columnar-shaped or needle-shaped protrusion 103c. That is, the front surface of the crystalline semiconductor layer 103 includes the columnar-shaped or needle-shaped protrusion 103c (also referred to as a whisker). Note that the crystalline semiconductor layer 103 includes at least one whisker. A plurality of whiskers is also referred to as a whisker group. The surface area of the crystalline semiconductor layer 103 can be increased by including such a whisker; thus, various performances of the power storage device, for example, the charge and discharge capacities can be improved.

Then, as described above, the adhesion between the current collector 101 and the crystalline semiconductor layer 103 can be increased by performing the surface treatment on the current collector 101 before the formation of the crystalline semiconductor layer 103. In particular, the crystalline semiconductor layer 103 is separated from the current collector 101 because a crystalline semiconductor has high internal stress; thus, the performance of the power storage device might be lowered. Therefore, the performance of the power storage device can be improved by increasing the adhesion.

In addition, the active material layer can be formed by vapor-phase growth; therefore, throughput can be improved. Since a crystalline semiconductor layer can be formed on the front surface and the rear surface of the current collector 101 in one deposition step, the number of steps can be reduced in the case where the electrode is formed using both of the surfaces of the current collector 101. This is effective in manufacturing a stacked-type power storage device as illustrated in FIG. 4B, for example.

Note that a layer (refer to a layer 107 in FIGS. 3A to 3C) including the material of the current collector 101 and the material (e.g., silicon) of the crystalline semiconductor layer 103 may be formed on the front surface of the current collector 101. The layer is a mixture layer in which the materials are mixed with each other or a compound layer (e.g., a silicide layer) in which the materials are reacted with each other. That is, part of the current collector 101 serves as a mixture layer or a compound layer. Alternatively, the entire current collector 101 may serve as a mixture layer or a compound layer.

The adhesion between the current collector 101 and the crystalline semiconductor layer 103 can be increased by having such a mixture layer or a compound layer. Moreover, since resistance at the interface between the current collector 101 and the crystalline semiconductor layer 103 can be reduced, the charge and discharge capacities can be improved.

Note that examples of the metal element which forms the silicide described above include zirconium, titanium, hafnium, vanadium, niobium, tantalum, chromium, molybdenum, tungsten, cobalt, and nickel. Silicide is a compound of these metal elements (e.g., zirconium silicide).

As described above, separation of the crystalline semiconductor layer 103 is suppressed by providing the crystalline semiconductor layer 103 on and in close contact with the current collector 101; thus, deterioration of the power storage device can be suppressed. Therefore, it is possible to improve cycle characteristics of the power storage device. Specifically, a specific capacity (also referred to as a capacity holding rate) of a tenth cycle number with respect to a first cycle number can be greater than or equal to 90%. A specific capacity of a hundredth cycle number with respect to a first cycle number can be greater than or equal to 70%.

Next, two lithium ion secondary batteries, Sample A and Sample B, are manufactured, and advantageous effect of one embodiment of the present invention will be specifically described.

In Sample A, surface treatment is performed on a current collector; in Sample B, which is for comparison, surface treatment is not performed on a current collector. The conditions other than the surface treatment are the same.

As a specific manufacturing process of Sample A, titanium foil was used as the current collector, and surface treatment was performed on the titanium foil. As the surface treatment, after treatment with a hydrofluoric acid whose concentration was 0.5% was performed for 10 minutes, running water treatment was performed and then blow was performed using nitrogen.

Then, a crystalline silicon layer was formed over the titanium foil by an LPCVD method. As the conditions of the LPCVD method, the pressure and the substrate temperature of a treatment chamber were set to 20 Pa and 600° C., respectively; silane whose flow rate was set to 300 sccm was introduced into the treatment chamber; and the process was performed for 2 hours and 15 minutes.

On the other hand, in manufacturing Sample B, surface treatment was not performed on the current collector (titanium foil) but other conditions were the same as those of Sample A. Each sample was observed before and after the formation of the respective crystalline silicon layers.

Figure 10A:
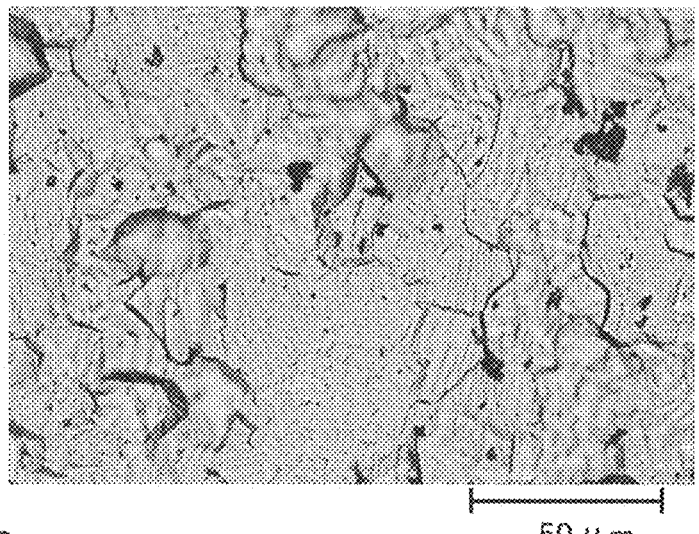
FIGS. 10A and 10B are optical micrographs of a current collector.

First, FIG. 10A is a plan photograph of the titanium foil Ti in Sample A (with surface treatment) before the formation of the crystalline silicon layer. The photograph was taken by an optical microscope (OM).

Figure 10B:
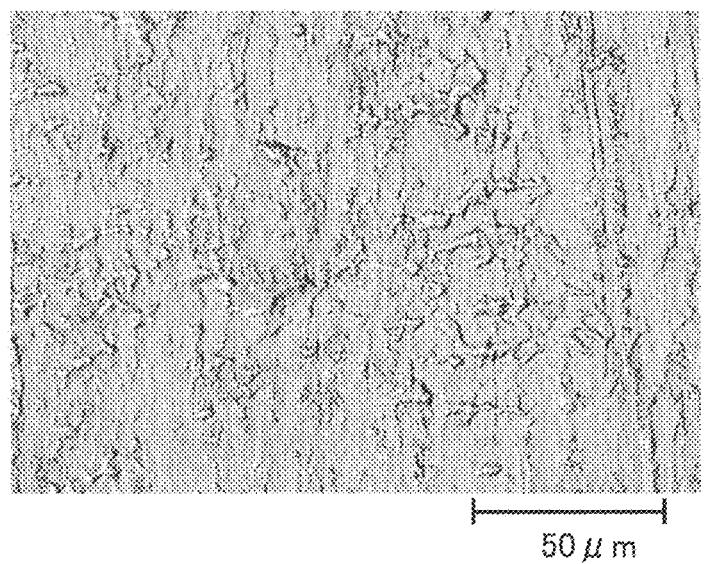

FIG. 10B is a plan photograph of the titanium foil Ti in Sample B (without surface treatment) before the formation of the crystalline silicon layer.

From the optical micrographs, the depression and projection on the surface of the titanium foil Ti of Sample A (FIG. 10A) with surface treatment was observed to be larger than that of Sample B (FIG. 10B) without surface treatment.

Figure 8:
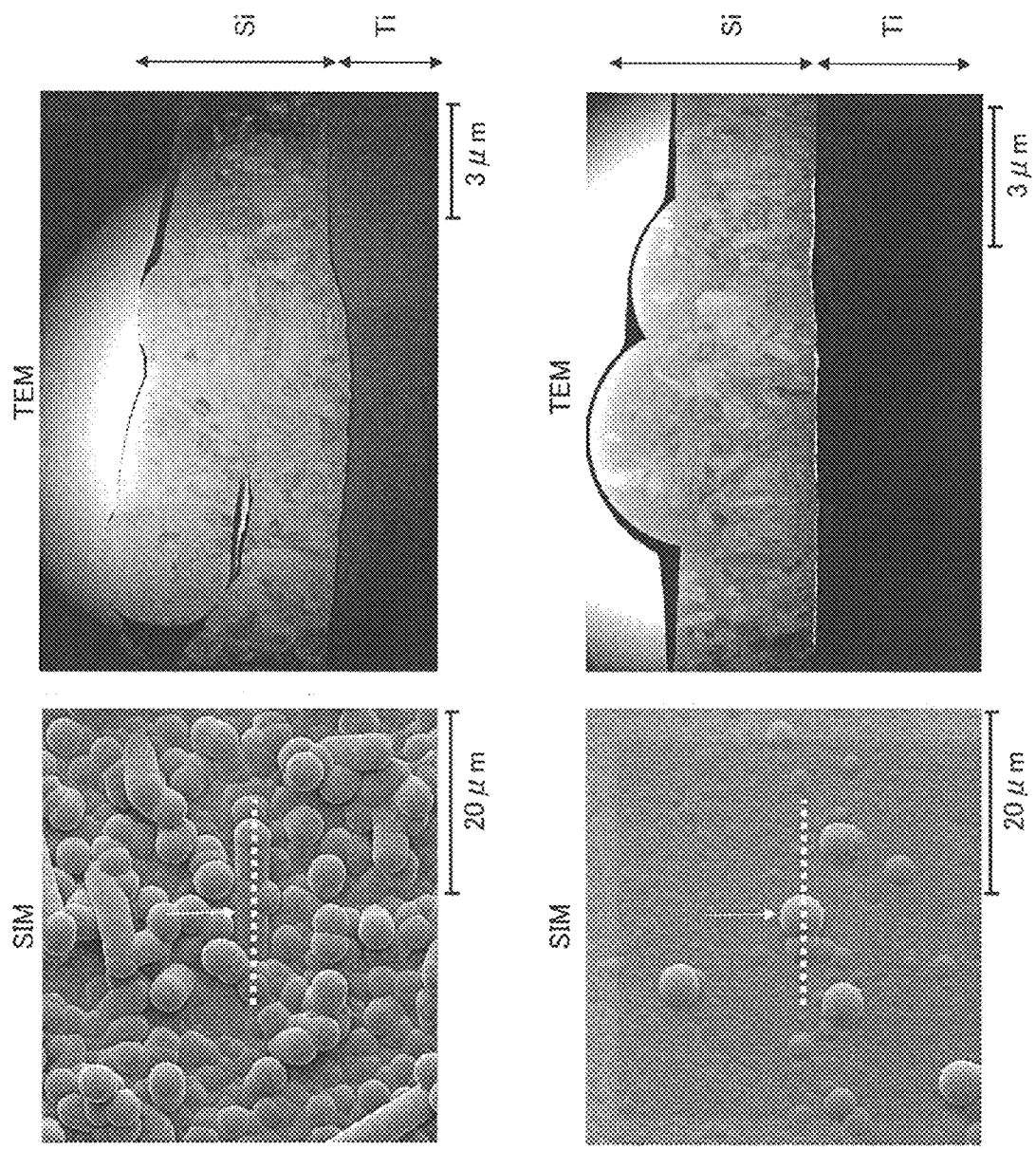
FIGS. 8A and 8B each show an SIM photograph and a TEM photograph.

FIG. 8A is a plan photograph (a left-hand photograph) of Sample A (with surface treatment) after the formation of the crystalline silicon layer, which is taken by a scanning ion microscope (SIM), and a cross-sectional photograph (a right-hand photograph) of the SIM photograph, which is observed from the direction of an arrow and taken by a transmission electron microscope (TEM).

FIG. 8B is a SIM plan photograph (a left-hand photograph) of Sample B (without surface treatment) after the formation of the crystalline silicon layer and a TEM cross-sectional photograph (a right-hand photograph) of the SIM photograph, which is observed from the direction of an arrow.

From the TEM photographs, in Sample B (FIG. 8B) without surface treatment, a space was observed to be generated between the titanium foil Ti and crystalline silicon Si; in Sample A (FIG. 8A) subjected to hydrofluoric acid treatment, a space was not observed to be generated between the titanium foil Ti and crystalline silicon Si. That is, it is found that, owing to functions of the anchor effect or the like described above, adhesion between the current collector and the active material layer is increased by performing surface treatment.

Moreover, from the SIM photographs, it was possible to observe whiskers of Sample A to be grown longer and to have higher density than whiskers of Sample B. That is, it is inferred that the growth of whiskers is promoted because the adhesion between the current collector and the active material layer is increased by performing surface treatment.

Note that from results detected by an energy dispersive X-ray spectroscope (EDX), it was observed that iron and nickel is included in each titanium foil Ti.

Subsequently, Sample A and Sample B were used as electrodes and lithium ion secondary batteries were manufactured. Here, coin-type lithium ion secondary batteries were manufactured. A manufacturing method of the coin-type lithium ion secondary batteries is described with reference to FIG. 9. Note that both Sample A and Sample B were manufactured under the same conditions.

Figure 9:
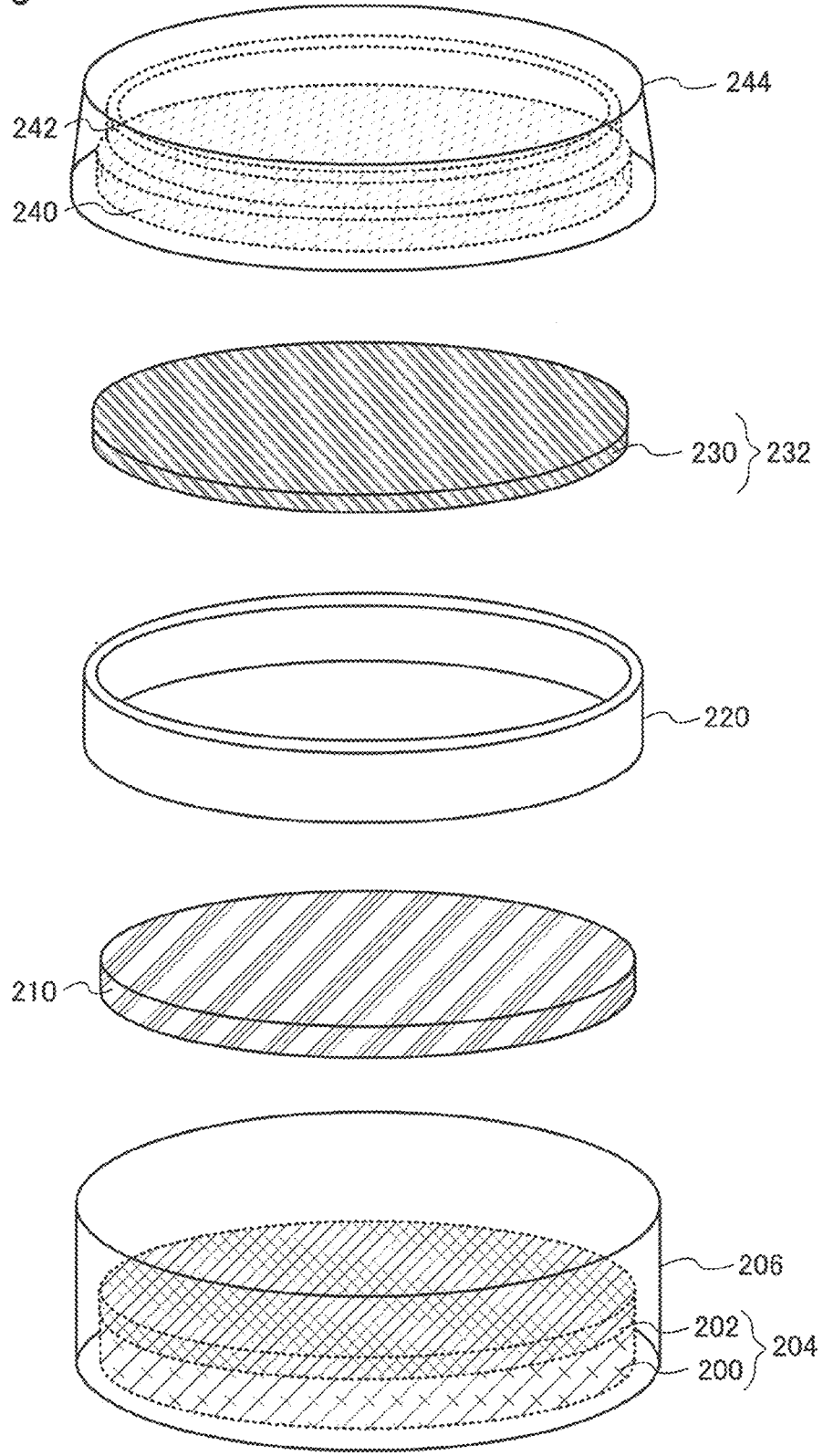
FIG. 9 is a diagram showing an example of a method for manufacturing a secondary battery.

As illustrated in FIG. 9, the coin-type lithium ion secondary battery includes an electrode 204, a reference electrode 232, a separator 210, an electrolyte solution (not illustrated), a housing 206, and a housing 244. Besides, the coin-type secondary battery includes a ring-shaped insulator 220, a spacer 240, and a washer 242. As the electrode 204, the electrode that was obtained in the above step, in which a crystalline silicon layer (an active material layer 202) was provided over titanium foil (a current collector 200), was used. The reference electrode 232 includes a reference electrode active material layer 230. In addition, the reference electrode active material layer 230 was formed using lithium metal (lithium foil). The separator 210 was formed using polypropylene. The housing 206, the housing 244, the spacer 240, and the washer 242 each of which was made using stainless steel (SUS) were used. The housing 206 and the housing 244 have a function of making external electrical connection of the electrode 204 and the reference electrode 232.

The electrode 204, the reference electrode 232, and the separator 210 were soaked in the electrolyte solution. Then, as illustrated in FIG. 9, the housing 206, the electrode 204, the separator 210, the ring-shaped insulator 220, the reference electrode 232, the spacer 240, the washer 242, and the housing 244 were stacked in this order so that the housing 206 was positioned at the bottom of the stacked components. The housing 206 and the housing 244 were pressed and bonded to each other with a "coin cell crimper". In such a manner, the coin-type secondary batteries were manufactured.

Figure 2A:
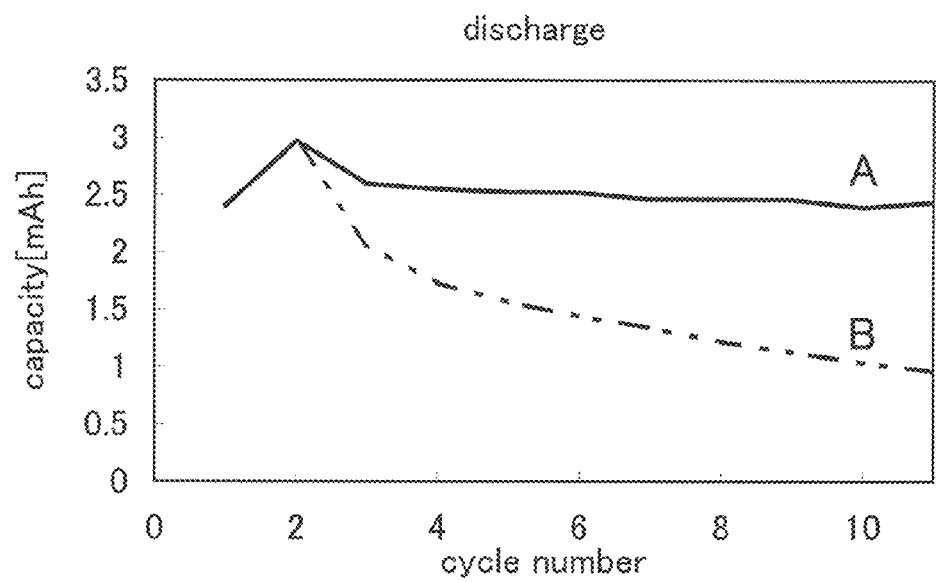
FIGS. 2A and 2B are graphs each showing cycle characteristics.

FIG. 2A shows cycle characteristics in discharging the lithium ion secondary batteries. A solid line A denotes Sample A (with surface treatment), and a dashed line B denotes Sample B (without surface treatment).

Figure 2B:
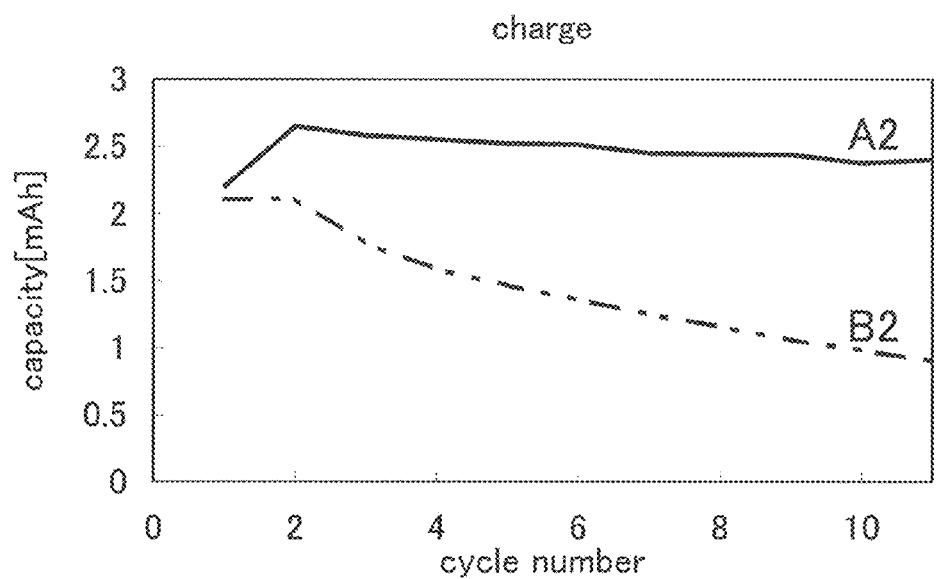

On the other hand, FIG. 2B shows cycle characteristics in charging the lithium ion secondary batteries. A solid line A2 denotes Sample A (with surface treatment), and a dashed line B2 denotes Sample B (without surface treatment).

Note that in both FIGS. 2A and 2B, the vertical axis indicates capacity and the horizontal axis indicates a cycle number. For the measurements of charge and discharge, a constant current mode was used, and charge and discharge were performed with a current of 0.2 mA. The upper limit voltage was 1.0 V, and the lower limit voltage was 0.03 V. All of the measurements were performed at room temperature.

From FIGS. 2A and 2B, a decrease in the capacity of Sample B (the dashed lines B and B2) without surface treatment was observed with repeated cycle. On the other hand, in Sample A (the solid lines A and A2) with surface treatment, a decrease of the capacity was not observed. Further, in Sample A with surface treatment, a specific capacity of a tenth cycle number (also referred to as a tenth cycle) with respect to a first cycle number (also referred to as a first cycle) was 99.7% in discharging and 108.0% in charging the lithium ion second battery.

Note that the weight of the active material in Sample A was 1.6 mg, and the discharge capacity per unit weight of the active material was 1500 mAh/g in the first cycle (also referred to as initial capacity). This value is extremely higher than 372 mAh/g of, for example, the theoretical capacity of a power storage device in which a graphite electrode was used.

Through the above results, the adhesion between the current collector and the crystalline semiconductor layer is increased by performing surface treatment; thus, cycle characteristics of the charge and discharge are observed to be improved. Further, an observation is made that cycle characteristics can be improved by increasing the adhesion without limitation to the method for performing surface treatment. Note that as the surface treatment, treatment using the hydrofluoric acid which is described above, a hydrochloric acid, a sulfuric acid, or a mixed acid thereof; plasma such as $NF_3$ plasma, $SiF_4$ plasma, or $ClF_3$ plasma; or the like can be performed. Alternatively, another treatment may be employed. Moreover, the adhesion can be further improved by combining these treatments.

This embodiment can be combined with any of the other embodiments as appropriate.

Embodiment 2

In this embodiment, a specific example of the structure of the power storage device will be shown.

Figure 3A:
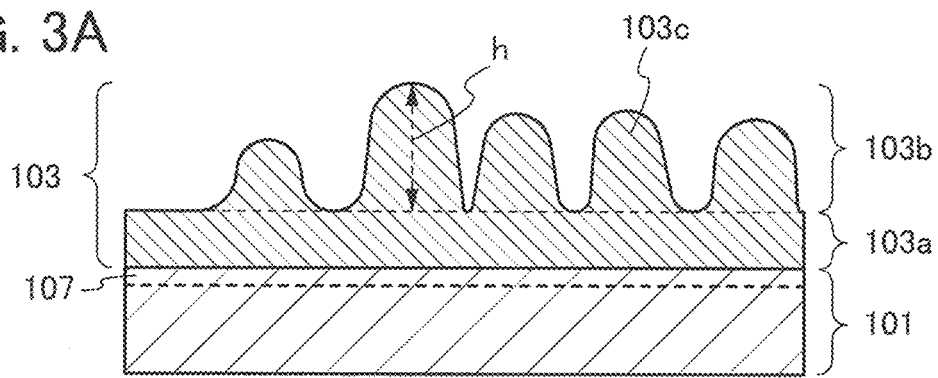
FIGS. 3A to 3C are cross-sectional views illustrating a structure of a power storage device.

FIG. 3A is an enlarged view of a region surrounded with a dashed line 105 in FIG. 1C.

As illustrated in FIG. 3A, the crystalline semiconductor layer 103 (the active material layer) includes a crystalline semiconductor region 103a which covers the current collector 101 and a crystalline semiconductor region 103b including a whisker (the protrusion 103c), which is formed over the crystalline semiconductor region 103a. That is, the crystalline semiconductor layer 103 includes a whisker.

Note that the interface between the crystalline semiconductor region 103a and the crystalline semiconductor region 103b is not clear. Therefore, a plane that is at the same level as the bottom of the deepest valley among valleys formed between the protrusions 103c and is parallel to a surface of the current collector 101 is regarded as the interface between the crystalline semiconductor region 103a and the crystalline semiconductor region 103b.

Specific examples of the shape of the protrusion 103c includes a columnar shape such as a cylinder shape or a prism shape and a needle shape such as a cone shape or a pyramid shape. The top of the protrusion 103c may be rounded. The diameter of the protrusion 103c is greater than or equal to 50 nm and less than or equal to 10 µm, preferably greater than or equal to 500 nm and less than or equal to 3 µm. In addition, a length h along the axis of the protrusion 103c is greater than or equal to 500 nm and less than or equal to 1000 µm, preferably greater than or equal to 1.0 µm and less than or equal to 100 µm. Moreover, the number of protrusions 103c per 100 µm² is greater than or equal 1 and less than or equal to 500, preferably greater than or equal to 10 and less than or equal to 50.

Note that the length h of the axis of the protrusion 103c means the distance between the top (or the center of the top surface) of the protrusion 103c and the crystalline semiconductor region 103a in the axis running through the top of the protrusion 103c (or the center of the top surface).

In addition, the thickness of the crystalline semiconductor layer 103 (the active material layer) corresponds to the sum of the thickness of the crystalline semiconductor region 103a and the thickness of the crystalline semiconductor region 103b. Here, the thickness of the crystalline semiconductor region 103b is the length of a perpendicular line from the top of the protrusion 103c to the crystalline semiconductor region 103a (that is, the height of the protrusion).

Further, the diameter of the protrusion 103c is the length of a long axis in a transverse cross-sectional shape at the root of the protrusion 103c.

Note that the direction in which the protrusion 103c extends from the crystalline semiconductor region 103a is referred to as a long-side direction. A cross-sectional shape along the long-side direction is referred to as a long-side cross-sectional shape. In addition, the shape of a plane in which the long-side direction is a normal direction is referred to as a transverse cross-sectional shape.

In FIG. 3A, the longitudinal directions of the protrusions 103c extend in one direction, for example, in the direction normal to the surface of the crystalline semiconductor region 103a. Note that the long-side direction of the protrusion 103c may be substantially the same as the normal direction to the surface of the crystalline semiconductor region 103a, and it is preferable that the difference between the angles of the directions be typically within 5°. The longitudinal direction of the protrusion 103c is substantially the same as the direction normal to the surface of the crystalline semiconductor region 103a as described above; therefore, FIG. 3A illustrates only the longitudinal cross-sectional shape of the protrusions 103c.

Since the crystalline semiconductor region 103b including a whisker is thus included, the surface area per unit mass of the crystalline semiconductor layer 103 (the active material layer) can be increased.

When the surface area is increased, the rate at which a reaction substance (e.g., lithium ions) in the power storage device is occluded by (or released from) the crystalline semiconductor layer is increased. When the rate at which the reaction substance is occluded (or released) is increased, the amount of occlusion or the amount of release of the reaction substance per unit time is increased; therefore, the charge and discharge capacities of the power storage device can be increased.

Figure 3B:
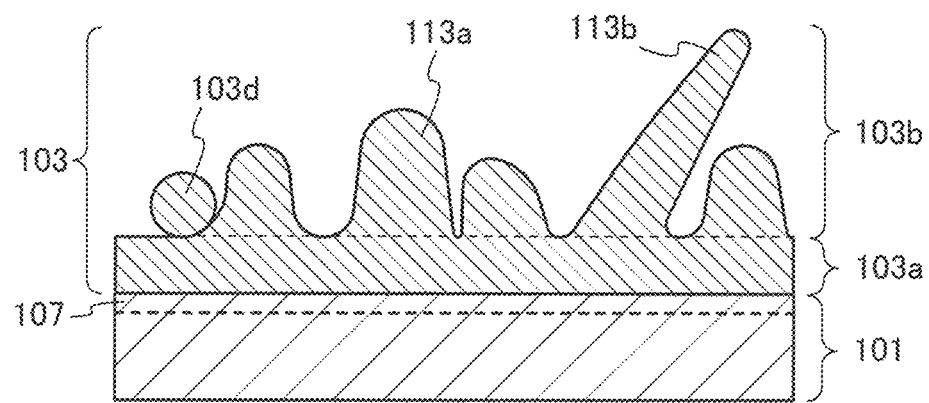

As another example, the long-side directions of a plurality of protrusions may be extended randomly as illustrated in FIG. 3B. Typically, the crystalline semiconductor region 103b including a whisker may include a first protrusion 113a whose long-side direction is substantially the same as the normal direction and a second protrusion 113b whose long-side direction is different from the normal direction. Further, the length in the axis of the second protrusion 113b may be greater than that of the first protrusion 113a. Since the long-side directions of the plurality of protrusions are thus extended randomly, a transverse cross-sectional shape of a protrusion (a region 103d) exists in addition to the long-side cross-sectional shapes of protrusions in FIG. 3B.

The region 103d is circular because it is a transverse cross-sectional shape of a protrusion having a cylinder or cone shape. However, when the protrusion has a prism or pyramid shape, the region 103d is polygonal. When the long-side directions of the protrusions are thus extended randomly, the protrusions are tangled with each other in some cases; therefore, the protrusions are unlikely to be separated in charging and discharging the power storage device. Consequently, the charge and discharge characteristics can be stabilized.

Figure 3C:
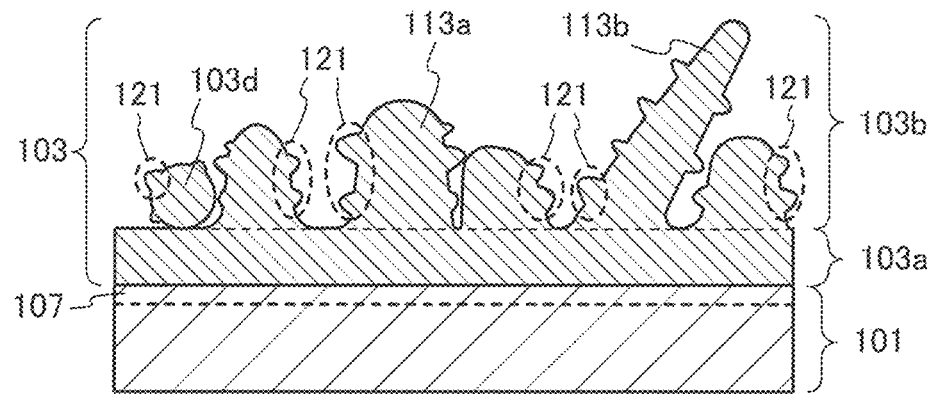

As another example, as illustrated in FIG. 3C, a protrusion may include a depression and projection 121 (also referred to as a depression and a projection). Alternatively, a protrusion may include either a depression or a projection. By including the depression and projection 121, the protrusion can have a larger surface area. That is, the surface area per unit mass of the crystalline semiconductor layer 103 can be much larger than that in FIG. 3B; therefore, the charge and discharge capacities can be increased.

As illustrated in FIGS. 3A to 3C, the layer 107 (also referred to as a material layer) may be formed on the surface of the current collector 101. The layer 107 is a mixture layer in which the material of the current collector 101 and the material (e.g., silicon) of the crystalline semiconductor layer 103 are mixed with each other or a compound layer (silicide) in which the material of the current collector 101 and the material of the crystalline semiconductor layer 103 are reacted with each other. That is, the layer 107 is a layer including the material of the current collector 101 and the material of the crystalline semiconductor layer 103. Note that the layer 107 is described as part of the current collector 101. Alternatively, the entire current collector 101 may serve as a mixture layer or a compound layer.

The adhesion between the current collector 101 and the crystalline semiconductor layer 103 can be increased by having the layer 107. Moreover, since the resistance at the interface between the current collector 101 and the crystalline semiconductor layer 103 can be reduced by having the layer 107, the charge and discharge capacities can be improved.

Note that examples of the metal element which forms the silicide described above include zirconium, titanium, hafnium, vanadium, niobium, tantalum, chromium, molybdenum, tungsten, cobalt, and nickel. Silicide is a compound of these metal elements (e.g., zirconium silicide).

Note that an impurity element imparting one conductivity type, such as phosphorus or boron, may be added to the crystalline semiconductor layer 103. The conductivity of the crystalline semiconductor layer 103 is increased by adding the impurity element imparting one conductivity type, such as phosphorus or boron, so that the conductivity of the electrode can be increased. Therefore, the charge and discharge capacities can be further increased.

The power storage device includes a first electrode including the current collector 101 and the crystalline semiconductor layer 103 as described above, an electrolyte, and a second electrode (also referred to as a counter electrode) which is provided to face the first electrode with the electrolyte interposed therebetween.

This embodiment can be combined with any of the other embodiments as appropriate.

Embodiment 3

In this embodiment, a structure of a power storage device will be described with reference to FIGS. 4A and 4B.

First, a structure of a secondary battery is described below as a power storage device.

Among secondary batteries, a lithium ion battery formed using a metal oxide containing lithium, such as $LiCoO_2$, has a large discharge capacity and high safety. Here, a structure of a lithium ion battery, which is a typical example of the secondary battery, will be described.

Figure 4A:
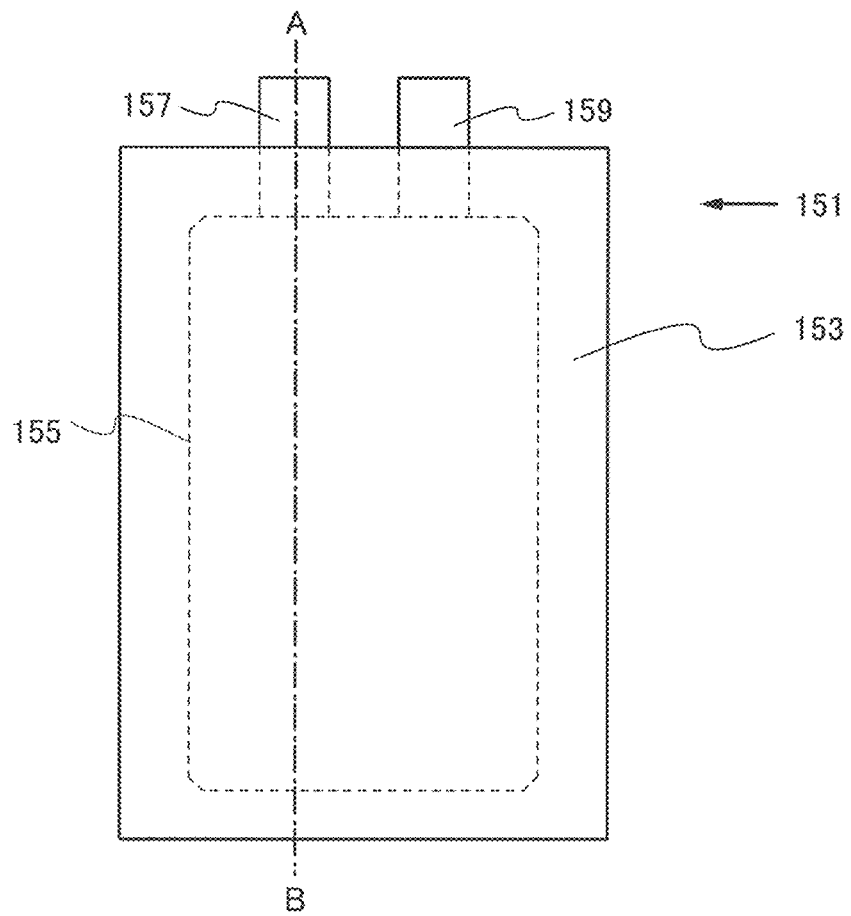
FIGS. 4A and 4B are a plan view and a cross-sectional view, respectively, illustrating a structure of a secondary battery.
Figure 4B:
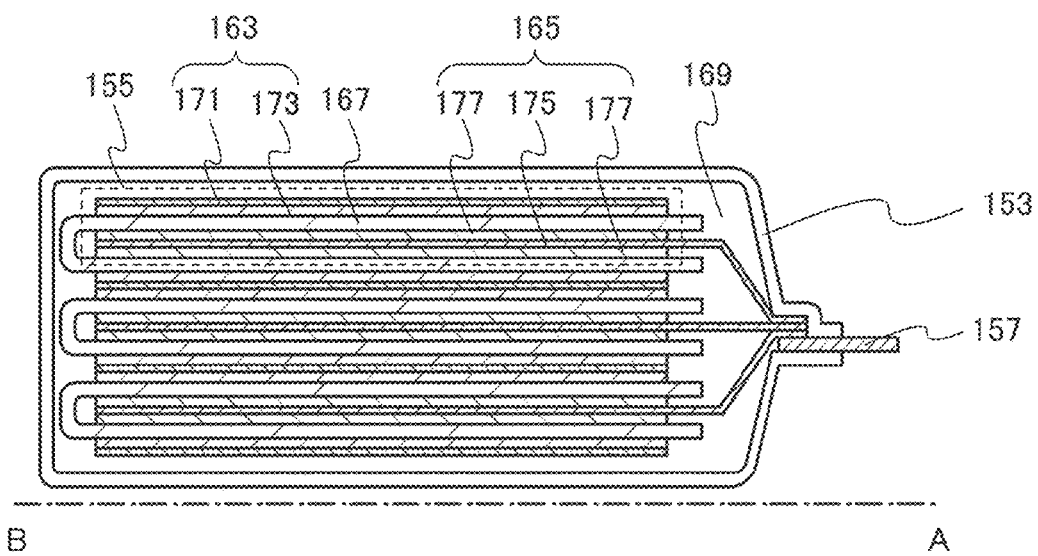

FIG. 4A is a plan view of a power storage device 151, and FIG. 4B is a cross-sectional view taken along dot-dashed line A-B in FIG. 4A.

The power storage device 151 in FIG. 4A includes a power storage cell 155 in an exterior member 153. The power storage device 151 further includes a terminal portion 157 and a terminal portion 159 which are connected to the power storage cell 155. For the exterior member 153, a laminate film, a polymer film, a metal film, a metal case, a plastic case, or the like can be used.

As illustrated in FIG. 4B, the power storage cell 155 includes a negative electrode 163, a positive electrode 165, a separator 167 provided between the negative electrode 163 and the positive electrode 165, and an electrolyte 169 with which the exterior member 153 is filled.

The negative electrode 163 includes a negative electrode current collector 171 and a negative electrode active material layer 173. The electrode in Embodiment 1 can be used as the negative electrode 163. In addition, by forming the negative active material layer which is formed using the crystalline silicon layer, with the negative electrode current collector held by a frame-like susceptor in an LPCVD apparatus, the negative active material layer can be formed on both of the surfaces of the negative electrode current collector at the same time; therefore, the number of steps can be reduced.

The positive electrode 165 includes a positive electrode current collector 175 and a positive electrode active material layer 177. The negative electrode active material layer 173 is formed on one or both of the surfaces of the negative electrode current collector 171. The positive electrode active material layer 177 is formed on one or both of the surfaces of the positive electrode current collector 175.

The negative electrode current collector 171 is connected to the terminal portion 157. The positive electrode current collector 175 is connected to the terminal portion 159. Further, the terminal portion 157 and the terminal portion 159 each partly extend outside the exterior member 153.

Note that although a sealed thin power storage device is described as the power storage device 151 in this embodiment, a power storage device having a variety of shapes, for example, a button storage device, a cylindrical power storage device, or a rectangular power storage device can be used. Further, although the structure where the positive electrode, the negative electrode, and the separator are stacked is described in this embodiment, a structure where the positive electrode, the negative electrode, and the separator are rolled may be employed.

Aluminum, stainless steel, or the like is used for the positive electrode current collector 175. The positive electrode current collector 175 can have a foil shape, a plate shape, a net shape, or the like as appropriate.

The positive electrode active material layer 177 can be formed using $LiFeO_2$, $LiCoO_2$, $LiNiO_2$, $LiMn_2O_4$, $LiFePO_4$, $LiCoPO_4$, $LiNiPO_4$, $LiMn_2PO_4$, $V_2O_5$, $Cr_2O_5$, $MnO_2$, or other lithium compounds as a material. Note that when carrier ions are alkaline earth metal ions or alkali metal ions other than lithium ions, the positive electrode active material layer 177 can be formed using, instead of lithium in the above lithium compounds, an alkali metal (e.g., sodium or potassium), an alkaline earth metal (e.g., calcium, strontium, or barium), beryllium, or magnesium.

As a solute of the electrolyte 169, a material in which lithium ions, i.e., carrier ions can transfer and stably exist is used. Typical examples of the solute of the electrolyte include lithium salt such as $LiClO_4$, $LiAsF_6$, $LiBF_4$, $LiPF_6$, and $Li(C_2F_5SO_2)_2N$. Note that when carrier ions are alkaline earth metal ions or alkali metal ions other than lithium ions, the solute of the electrolyte 169 can be formed using alkali metal salt such as sodium salt or potassium salt; alkaline earth metal salt such as calcium salt, strontium salt, or barium salt; beryllium salt; magnesium salt; or the like, as appropriate.

As the solvent of the electrolyte 169, a material which can transfer lithium ions is used. As the solvent of the electrolyte 169, an aprotic organic solvent is preferably used. Typical examples of an aprotic organic solvent include ethylene carbonate, propylene carbonate, dimethyl carbonate, diethyl carbonate, γ-butyrolactone, acetonitrile, dimethoxyethane, and tetrahydrofuran, and one or more of these materials can be used. When a polymer material which is subjected to gelation is used as the solvent of the electrolyte 169, safety of the power storage device 151 against liquid leakage or the like is increased. In addition, the power storage device 151 can be thin and lightweight. Typical examples of the polymer material which is subjected to gelation include a silicon gel, an acrylic gel, an acrylonitrile gel, polyethylene oxide, polypropylene oxide, and a fluorine-based polymer.

As the electrolyte 169, a solid electrolyte such as $Li_3PO_4$ can be used.

An insulating porous material is used for the separator 167. Typical examples of the separator 167 include cellulose (paper), polyethylene, and polypropylene.

A lithium ion battery has a small memory effect, a high energy density, and a large discharge capacity. In addition, the driving voltage of the lithium ion battery is high. Thus, the size and weight of the lithium ion battery can be reduced. Further, the lithium ion battery does not easily degrade due to repetitive charge and discharge and can be used for a long time, so that cost can be reduced.

Next, a capacitor will be described as a power storage device. Typical examples of a capacitor include a double-layer capacitor and a lithium ion capacitor.

In the case of a capacitor, instead of the positive electrode active material layer 177 in the secondary battery in FIG. 4B, a material capable of reversibly occluding lithium ions and/or anions is preferably used. Typical examples of the positive electrode active material layer 177 include active carbon, a conductive polymer, and a polyacene organic semiconductor (PAS).

The lithium ion capacitor has high efficiency of charge and discharge, capability of rapidly performing charge and discharge, and a long life even when it is repeatedly used.

By using the electrode described in Embodiment 1 as the negative electrode 163, a power storage device having a large discharge capacity can be manufactured.

In addition, by using the structure and material of the electrode described in Embodiment 1 in a negative electrode of an air cell which is one embodiment of the power storage device, a power storage device having a large discharge capacity can be manufactured.

This embodiment can be combined with any of the other embodiments as appropriate.

Embodiment 4

In this embodiment, an application example of the power storage device described in Embodiment 2 will be described with reference to FIGS. 5A and 5B.

The power storage device described in Embodiment 3 can be used in electronic devices, for example, cameras such as digital cameras or video cameras, digital photo frames, mobile phones (also referred to as cellular phones or cellular phone devices), portable game machines, portable information terminals, or audio reproducing devices. Further, the power storage device can be used in electric propulsion vehicles such as electric vehicles, hybrid vehicles, electric railway vehicles, maintenance vehicles, carts, or wheelchairs. Here, as a typical example of the electric propulsion vehicles, a wheelchair is described.

Figure 5A:
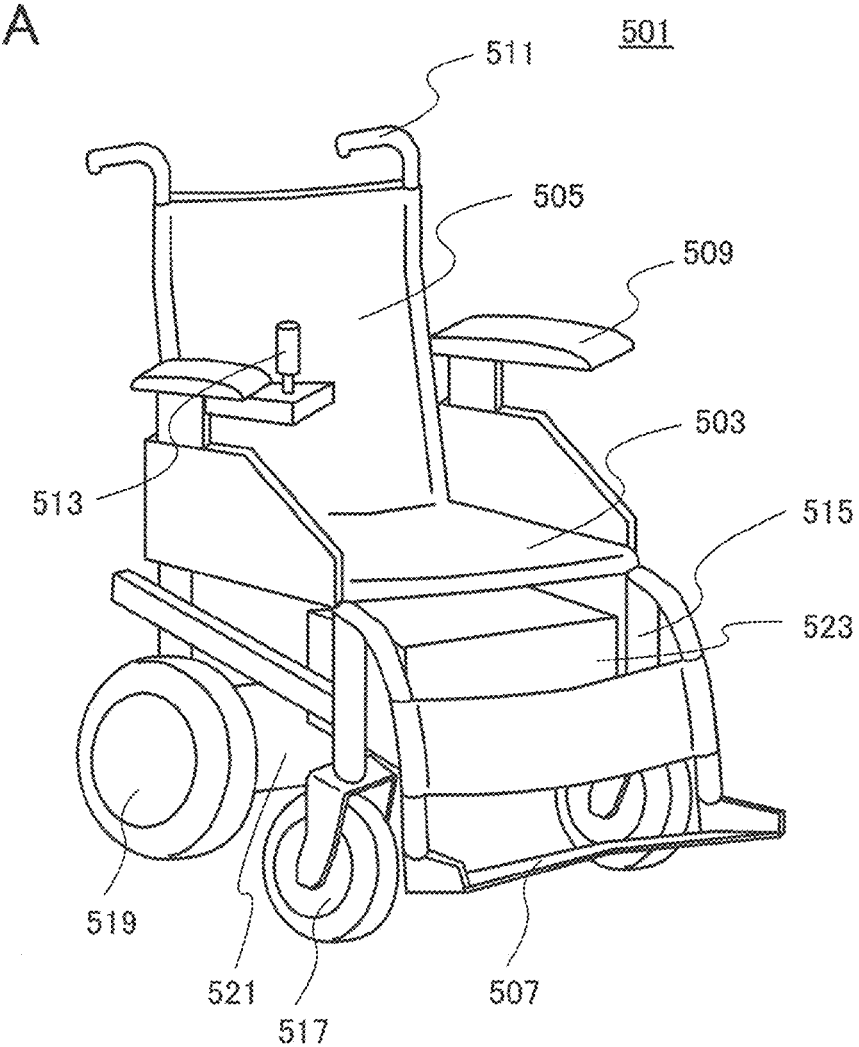
FIGS. 5A and 5B are diagrams each illustrating an electronic device.

FIG. 5A is a perspective view of an electric wheelchair 501. The electric wheelchair 501 includes a seat 503 where a user sits down, a backrest 505 provided behind the seat 503, a footrest 507 provided at the front of and below the seat 503, armrests 509 provided on the left and right of the seat 503, and a handle 511 provided above and behind the backrest 505. A controller 513 for controlling the operation of the wheelchair is provided for one of the armrests 509. A pair of front wheels 517 is provided at the front of and below the seat 503 through a frame 515 provided below the seat 503, and a pair of rear wheels 519 is provided behind and below the seat 503. The rear wheels 519 are connected to a driving portion 521 having a motor, a brake, a gear, and the like. A control portion 523 including a battery, a power controller, a control means, and the like is provided under the seat 503. The control portion 523 is connected to the controller 513 and the driving portion 521. The driving portion 521 drives through the control portion 523 with the operation of the controller 513 by the user and the driving portion 521 controls the operation of moving forward, moving backward, turning around, and the like, and the speed of the electric wheelchair 501.

The power storage device described in Embodiment 3 can be used as the battery of the control portion 523. The battery of the control portion 523 can be externally charged by electric power supply using plug-in systems or contactless power feeding. Note that in the case where the electric propulsion vehicle is an electric railway vehicle, the electric railway vehicle can be charged by electric power supply from an overhead cable or a conductor rail.

Figure 5B:
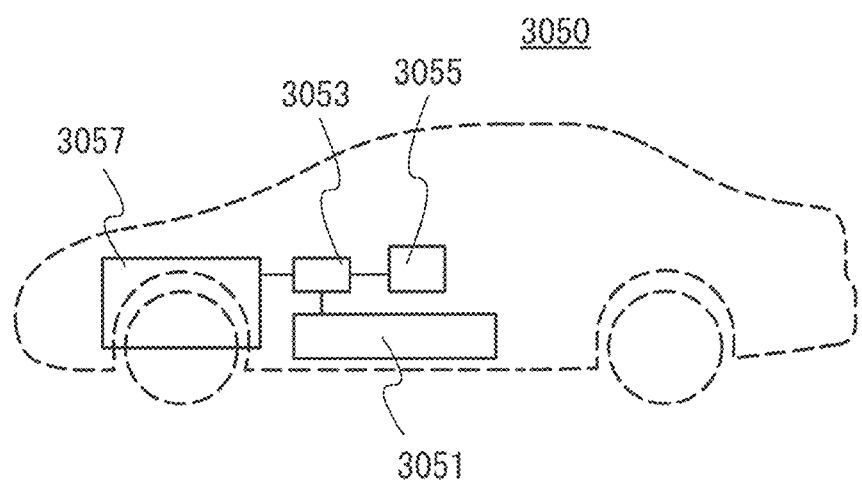

FIG. 5B shows an example of an electric vehicle. An electric vehicle 3050 is equipped with a power storage device 3051. The output of the electric power of the power storage device 3051 is controlled by a control circuit 3053 and the electric power is supplied to a driving device 3057. The control circuit 3053 is controlled by a computer 3055.

The driving device 3057 includes a DC motor or an AC motor either alone or in combination with an internal-combustion engine. The computer 3055 outputs a control signal to the control circuit 3053 based on input data such as data of operation (e.g., acceleration, deceleration, or stop) by a driver or data during driving (e.g., data on an upgrade or a downgrade, or data on a load on a driving wheel) of the electric vehicle 3050. The control circuit 3053 adjusts the electric energy supplied from the power storage device 3051 in accordance with the control signal of the computer 3055 to control the output of the driving device 3057. In the case where the AC motor is mounted, an inverter which converts direct current into alternate current is also incorporated.

Charge of the power storage device 3051 can be performed by external electric power supply using a plug-in technique. When the power storage device according to one embodiment of the present invention is provided as the power storage device 3051, a shorter charging time can be brought about and improved convenience can be realized. Besides, the higher charging and discharging rate of the power storage device can contribute to greater acceleration and excellent characteristics of the electric vehicle. When the power storage device 3051 itself can be formed to be compact and lightweight as a result of improved characteristics of the power storage device 3051, the vehicle can be lightweight and fuel efficiency can be increased.

This embodiment can be combined with any of the other embodiments as appropriate.

Embodiment 5

In this embodiment, an example in which the secondary battery according to one embodiment of the present invention is used in a wireless power feeding system (hereinafter referred to as an RF power feeding system) will be described with reference to block diagrams in FIG. 6 and FIG. 7. In each of the block diagrams, independent blocks show elements within a power receiving device and a power feeding device, which are classified according to their functions. However, it may be practically difficult to completely separate the elements according to their functions and one element can involve a plurality of functions in some cases.

First, the RF power feeding system is described with reference to FIG. 6.

A power receiving device 600 is an electronic device or an electric propulsion vehicle which is driven by electric power supplied from a power feeding device 700, and can be applied to another device which is driven by electric power, as appropriate. Typical examples of the electronic device include cameras such as digital cameras or video cameras, digital photo frames, mobile phones (also referred to as cellular phones or cellular phone devices), portable game machines, portable information terminals, audio reproducing devices, display devices, and computers. Typical examples of the electric propulsion vehicles include electric vehicles, hybrid vehicles, electric railway vehicles, maintenance vehicles, carts, and wheelchairs. In addition, the power feeding device 700 has a function of supplying electric power to the power receiving device 600.

Figure 6:
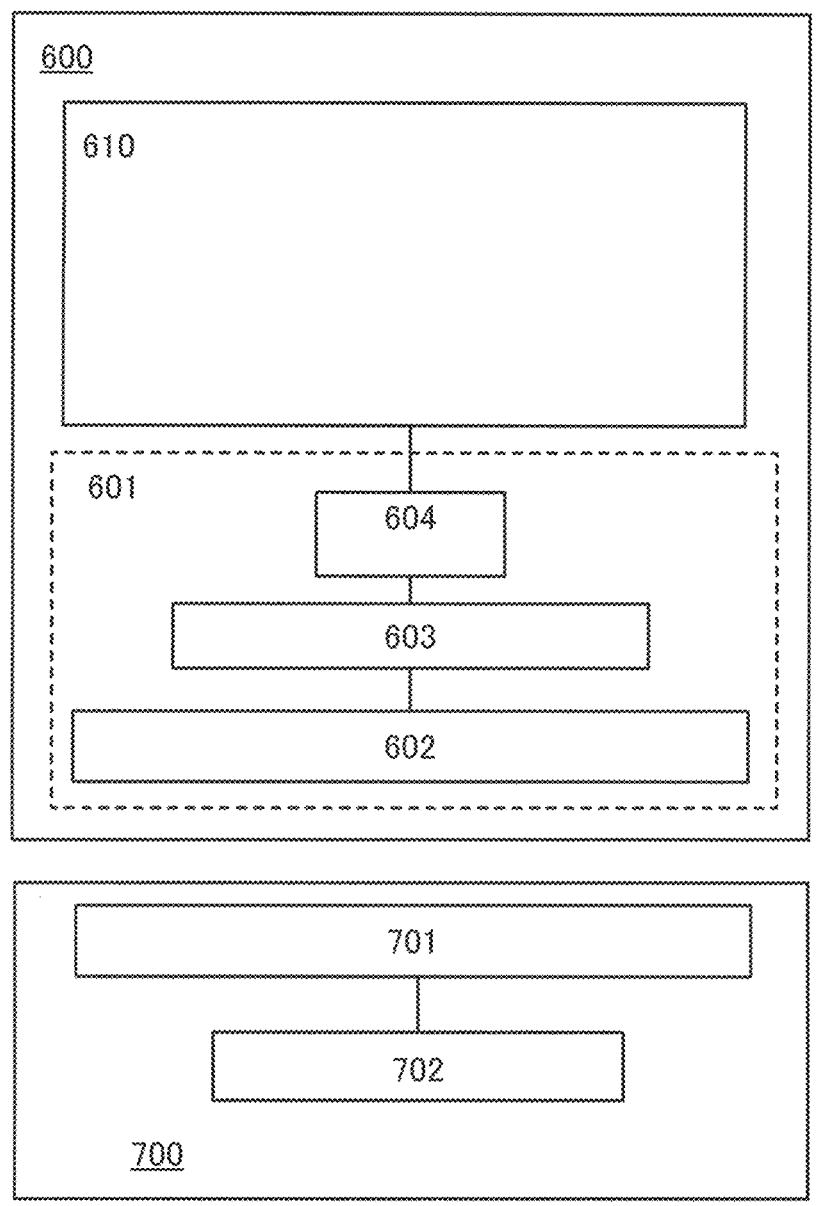
FIG. 6 is a diagram illustrating a configuration of a wireless power feeding system.

In FIG. 6, the power receiving device 600 includes a power receiving device portion 601 and a power load portion 610. The power receiving device portion 601 includes at least a power receiving device antenna circuit 602, a signal processing circuit 603, and a secondary battery 604. The power feeding device 700 includes at least a power feeding device antenna circuit 701 and a signal processing circuit 702.

The power receiving device antenna circuit 602 has a function of receiving a signal transmitted by the power feeding device antenna circuit 701 or transmitting a signal to the power feeding device antenna circuit 701. The signal processing circuit 603 processes a signal received by the power receiving device antenna circuit 602 and controls charging of the secondary battery 604 and supplying of electric power from the secondary battery 604 to the power load portion 610. In addition, the signal processing circuit 603 controls operation of the power receiving device antenna circuit 602. That is, the signal processing circuit 603 can control the intensity, the frequency, or the like of a signal transmitted by the power receiving device antenna circuit 602. The power load portion 610 is a driving portion which receives electric power from the secondary battery 604 and drives the power receiving device 600. Typical examples of the power load portion 610 include a motor and a driving circuit. Another device which drives the power receiving device by receiving electric power can be used as the power load portion 610, as appropriate. The power feeding device antenna circuit 701 has a function of transmitting a signal to the power receiving device antenna circuit 602 or receiving a signal from the power receiving device antenna circuit 602. The signal processing circuit 702 processes a signal received by the power feeding device antenna circuit 701. In addition, the signal processing circuit 702 controls operation of the power feeding device antenna circuit 701. That is, the signal processing circuit 702 can control the intensity, the frequency, or the like of a signal transmitted by the power feeding device antenna circuit 701.

The secondary battery according to one embodiment of the present invention is used as the secondary battery 604 included in the power receiving device 600 in the RF power feeding system illustrated in FIG. 6.

With the use of the secondary battery according to one embodiment of the present invention in the RF power feeding system, the amount of power storage can be made larger than that in a conventional secondary battery. Therefore, the time interval of the wireless power feeding can be lengthened (frequent power feeding can be omitted).

In addition, with the use of the secondary battery according to one embodiment of the present invention in the RF power feeding system, the power receiving device 600 can be formed to be compact and lightweight if the amount of power storage with which the power load portion 610 can be driven is the same as that in a conventional secondary battery. Therefore, the total cost can be reduced.

Next, another example of the RF power feeding system is described with reference to FIG. 7.

Figure 7:
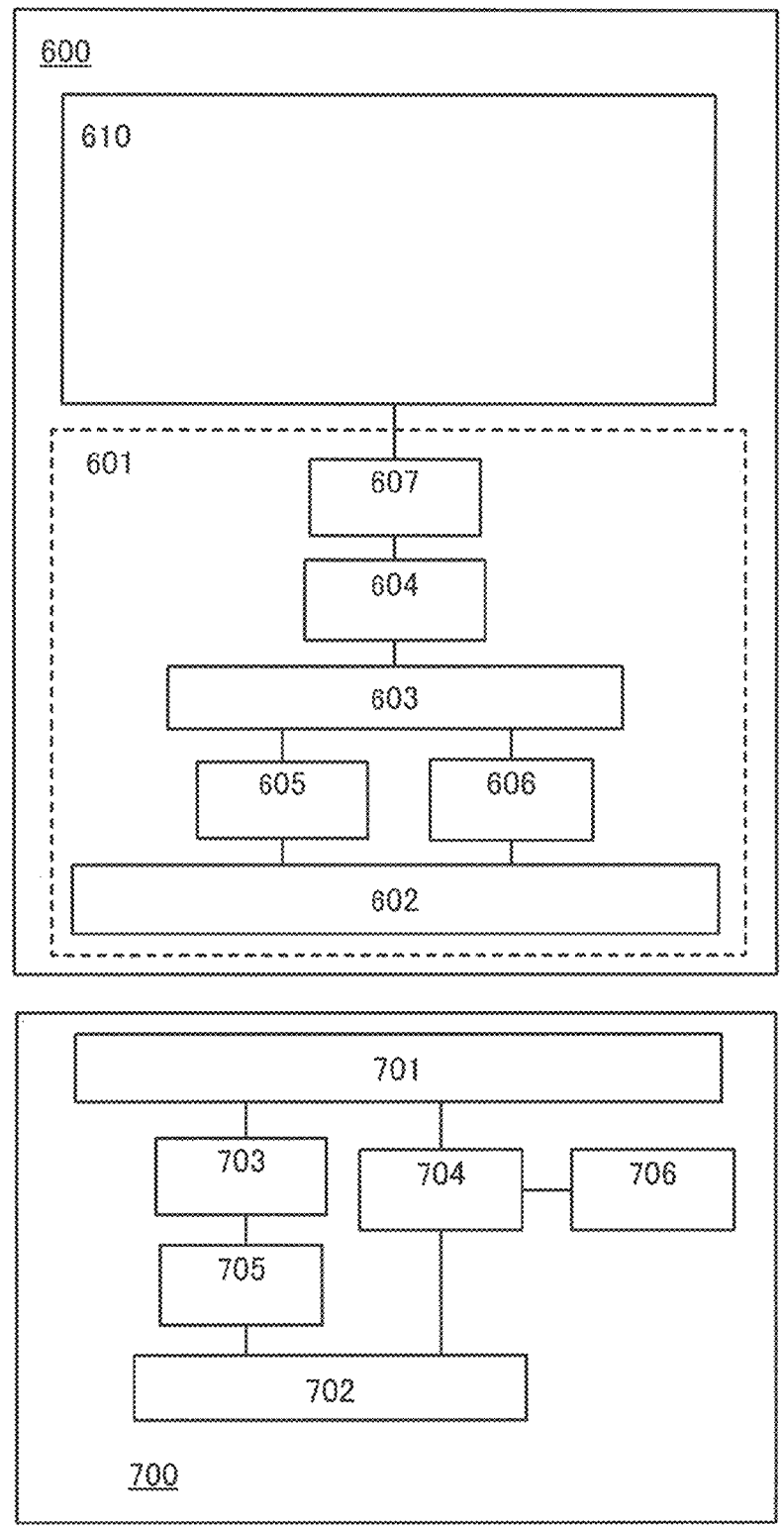
FIG. 7 is a diagram illustrating a configuration of a wireless power feeding system.

In FIG. 7, the power receiving device 600 includes the power receiving device portion 601 and the power load portion 610. The power receiving device portion 601 includes at least the power receiving device antenna circuit 602, the signal processing circuit 603, the secondary battery 604, a rectifier circuit 605, a modulation circuit 606, and a power supply circuit 607. In addition, the power feeding device 700 includes at least the power feeding device antenna circuit 701, the signal processing circuit 702, a rectifier circuit 703, a modulation circuit 704, a demodulation circuit 705, and an oscillator circuit 706.

The power receiving device antenna circuit 602 has a function of receiving a signal transmitted by the power feeding device antenna circuit 701 or transmitting a signal to the power feeding device antenna circuit 701. When the power receiving device antenna circuit 602 receives a signal transmitted by the power feeding device antenna circuit 701, the rectifier circuit 605 has a function of generating a DC voltage from the signal received by the power receiving device antenna circuit 602. The signal processing circuit 603 has a function of processing a signal received by the power receiving device antenna circuit 602 and controlling charging of the secondary battery 604 and supplying of electric power from the secondary battery 604 to the power supply circuit 607. The power supply circuit 607 has a function of converting voltages stored by the secondary battery 604 into voltages needed for the power load portion 610. The modulation circuit 606 is used when a certain response is transmitted from the power receiving device 600 to the power feeding device 700.

With the power supply circuit 607, electric power supplied to the power load portion 610 can be controlled. Thus, overvoltage application to the power load portion 610 can be suppressed, and deterioration or breakdown of the power receiving device 600 can be suppressed.

In addition, with the modulation circuit 606, a signal can be transmitted from the power receiving device 600 to the power feeding device 700. Therefore, when the amount of charged power in the power receiving device 600 is judged and a certain amount of power is charged, a signal is transmitted from the power receiving device 600 to the power feeding device 700 so that power feeding from the power feeding device 700 to the power receiving device 600 can be stopped. As a result, the secondary battery 604 is not fully charged, so that the number of times of charging the secondary battery 604 can be increased.

The power feeding device antenna circuit 701 has a function of transmitting a signal to the power receiving device antenna circuit 602 or receiving a signal from the power receiving device antenna circuit 602. When a signal is transmitted to the power receiving device antenna circuit 602, the signal processing circuit 702 generates a signal which is transmitted to the power receiving device 600. The oscillator circuit 706 generates a signal with a constant frequency. The modulation circuit 704 has a function of applying a voltage to the power feeding device antenna circuit 701 in accordance with the signal generated by the signal processing circuit 702 and the signal with a constant frequency generated by the oscillator circuit 706. Thus, a signal is output from the power feeding device antenna circuit 701. On the other hand, when a signal is received from the power receiving device antenna circuit 602, the rectifier circuit 703 has a function of rectifying the received signal. From signals rectified by the rectifier circuit 703, the demodulation circuit 705 extracts a signal transmitted from the power receiving device 600 to the power feeding device 700. The signal processing circuit 702 has a function of analyzing the signal extracted by the demodulation circuit 705.

Note that any circuit may be provided between circuits as long as the RF power feeding can be performed. For example, after the power receiving device 600 receives a signal and the rectifier circuit 605 generates a DC voltage, a circuit such as a DC-DC converter or a regulator that is provided in a subsequent stage is provided, and a constant voltage may be generated. Thus, overvoltage application to the inside of the power receiving device 600 can be suppressed.

The secondary battery according to one embodiment of the present invention is used as the secondary battery 604 included in the power receiving device 600 in the RF power feeding system illustrated in FIG. 7.

With the use of the secondary battery according to one embodiment of the present invention in the RF power feeding system, the amount of power storage can be made larger than that in a conventional secondary battery. Therefore, the time interval of the wireless power feeding can be lengthened (frequent power feeding can be omitted).

In addition, with the use of the secondary battery according to one embodiment of the present invention in the RF power feeding system, the power receiving device 600 can be formed to be compact and lightweight if the amount of power storage with which the power load portion 610 can be driven is the same as that in a conventional secondary battery. Therefore, the total cost can be reduced.

Note that when the secondary battery according to one embodiment of the present invention is used in the RF power feeding system, and the power receiving device antenna circuit 602 and the secondary battery 604 are overlapped with each other, it is preferable that the impedance of the power receiving device antenna circuit 602 be not changed by deformation of the secondary battery 604 due to charge and discharge of the secondary battery 604 and deformation of an antenna due to the above deformation. This is because, when the impedance of the antenna is changed, in some cases, electric power is not supplied sufficiently. For example, the secondary battery 604 may be placed in a battery pack formed using metal or ceramics. Note that in that case, the power receiving device antenna circuit 602 and the battery pack are preferably separated from each other by several tens of micrometers or more.

In addition, in this embodiment, the charging signal has no particular limitation on its frequency and may have any band of frequency as long as electric power can be transmitted. For example, the charging signal may have any of an LF band of 135 kHz (long wave), an HF band of 13.56 MHz, a UHF band of 900 MHz to 1 GHz, and a microwave band of 2.45 GHz.

A signal transmission method may be selected as appropriate from a variety of methods including an electromagnetic coupling method, an electromagnetic induction method, a resonance method, and a microwave method. In order to prevent energy loss due to foreign substances containing moisture, such as rain and mud, in this embodiment, the electromagnetic induction method or the resonance method using a low frequency band, specifically, very-low frequencies of 3 kHz to 30 kHz, low frequencies of 30 kHz to 300 kHz, medium frequencies of 300 kHz to 3 MHz, or high frequencies of 3 MHz to 30 MHz is preferably used.

This embodiment can be combined with any of the other embodiments as appropriate.

EXPLANATION OF REFERENCE

101: current collector, 103: crystalline semiconductor layer, 103c: protrusion, 105: dashed line, 107: layer, 151: power storage device, 153: exterior member, 155: power storage cell, 157: terminal portion, 159: terminal portion, 163: negative electrode, 165: positive electrode, 167: separator, 169: electrolyte, 171: negative electrode current collector, 173: negative electrode active material layer, 175: positive electrode current collector, 177: positive electrode active material layer, 200: current collector, 202: active material layer, 204: electrode, 206: housing, 210: separator, 220: ring-shaped insulator, 230: reference electrode active material layer, 232: reference electrode, 240: spacer, 242: washer, 244: housing, 501: wheelchair, 503: seat, 507: footrest, 509: armrest, 511: handle, 513: controller, 517: front wheel, 519: rear wheel, 521: driving portion, 523: control portion, 103a: crystalline semiconductor region, 103b: crystalline semiconductor region, 103d: region, 113a: protrusion, 113b: protrusion, 600: power receiving device, 601: power receiving device portion,

602: power receiving device antenna circuit, 603: signal processing circuit, 604: secondary battery, 605: rectifier circuit, 606: modulation circuit, 607: power supply circuit, 610: power load portion, 700: power feeding device, 701: power feeding device antenna circuit, 702: signal processing circuit, 703: rectifier circuit, 704: modulation circuit, 705: demodulation circuit, 706: oscillator circuit, 3050: electric vehicle, 3051: power storage device, 3053: control circuit, 3055: computer, and 3057: driving device.

This application is based on Japanese Patent Application serial No. 2010-148884 filed with the Japan Patent Office on Jun. 30, 2010 and Japanese Patent Application serial No. 2010-148879 filed with the Japan Patent Office on Jun. 30, 2010, the entire contents of which are hereby incorporated by reference.

The invention claimed is:

1. A method for manufacturing a power storage device comprising the steps of:
performing a surface treatment on a current collector; and
forming a crystalline semiconductor layer including a whisker over the current collector,
wherein the crystalline semiconductor layer comprises silicon,
wherein a diameter of the whisker is greater than or equal to 500 nm and less than or equal to 3 μm,
wherein a length along an axis of the whisker is greater than or equal to 500 nm and less than or equal to 1000 μm,
wherein the current collector comprises a metal element which forms silicide by reacting with silicon on a surface region of the current collector, and
wherein the surface treatment is performed on the current collector by using a material selected from the group consisting of a hydrofluoric acid, $NF_3$ plasma, $SiF_4$ plasma, and $ClF_3$ plasma.

2. A method for manufacturing a power storage device according to claim 1, wherein the surface treatment is performed on the current collector by using the material selected from the group consisting of a hydrofluoric acid, $NF_3$ plasma, $SiF_4$ plasma, and $ClF_3$ plasma and then processed with running water.

3. A method for manufacturing a power storage device comprising the steps of:
processing a current collector with a material selected from the group consisting of a hydrofluoric acid, $NF_3$ plasma, $SiF_4$ plasma, and $ClF_3$ plasma; and
forming a crystalline semiconductor layer including a whisker over the current collector,
wherein the crystalline semiconductor layer comprises silicon,
wherein a diameter of the whisker is greater than or equal to 500 nm and less than or equal to 3 μm,
wherein a length along an axis of the whisker is greater than or equal to 500 nm and less than or equal to 1000 μm, and
wherein the current collector comprises a metal element which forms silicide by reacting with silicon on a surface region of the current collector.

4. A method for manufacturing a power storage device according to claim 3, wherein the current collector is processed with the material selected from the group consisting of a hydrofluoric acid, $NF_3$ plasma, $SiF_4$ plasma, and $ClF_3$ plasma and then processed with running water.

5. A method for manufacturing a power storage device comprising the steps of:
processing a current collector with a material selected from the group consisting of a hydrofluoric acid, $NF_3$ plasma, $SiF_4$ plasma, and $ClF_3$ plasma; and
forming a crystalline semiconductor layer including a whisker over the current collector with a source gas containing silicon by a low-pressure chemical vapor deposition method,
wherein the crystalline semiconductor layer comprises silicon,
wherein a diameter of the whisker is greater than or equal to 500 nm and less than or equal to 3 μm,
wherein a length along an axis of the whisker is greater than or equal to 500 nm and less than or equal to 1000 μm, and
wherein the current collector comprises a metal element which forms silicide by reacting with silicon on a surface region of the current collector.

6. A method for manufacturing a power storage device according to claim 5,
wherein the current collector is processed with the material selected from the group consisting of a hydrofluoric acid, $NF_3$ plasma, $SiF_4$ plasma, and $ClF_3$ plasma and then processed with running water.

7. A method for manufacturing a power storage device according to claim 1, wherein a transverse cross-sectional shape of the whisker is circular.

8. A method for manufacturing a power storage device according to claim 5, wherein a transverse cross-sectional shape of the whisker is circular.

9. A method for manufacturing a power storage device according to claim 1, wherein the metal element is at least any one of titanium and nickel.

10. A method for manufacturing a power storage device according to claim 5, wherein the metal element is at least any one of titanium and nickel.

* * * * *